(12) United States Patent
Bohmer et al.

(10) Patent No.: US 10,516,082 B2
(45) Date of Patent: Dec. 24, 2019

(54) DEVICE FOR EMITTING LIGHT

(71) Applicant: Lumileds Holding B.V., Schiphol (NL)

(72) Inventors: Marcel Rene Bohmer, Aachen (DE); Roelof Koole, Aachen (DE)

(73) Assignee: LUMILEDS HOLDING B.V. (NL)

( * ) Notice: Subject to any disclaimer, the term of this patent is extended or adjusted under 35 U.S.C. 154(b) by 0 days.

(21) Appl. No.: 15/741,634

(22) PCT Filed: Jun. 29, 2016

(86) PCT No.: PCT/EP2016/065145
§ 371 (c)(1),
(2) Date: Jan. 3, 2018

(87) PCT Pub. No.: WO2017/005574
PCT Pub. Date: Jan. 12, 2017

(65) Prior Publication Data
US 2018/0198033 A1    Jul. 12, 2018

(30) Foreign Application Priority Data

Jul. 7, 2015    (EP) .................................. 15175663

(51) Int. Cl.
*H01L 33/50* (2010.01)

(52) U.S. Cl.
CPC .......... *H01L 33/501* (2013.01); *H01L 33/502* (2013.01); *H01L 2933/0041* (2013.01)

(58) Field of Classification Search
CPC ..... H01L 33/50–508; H01L 2933/0041; H01L 33/502
See application file for complete search history.

(56) References Cited

U.S. PATENT DOCUMENTS

| | | | |
|---|---|---|---|
| 2011/0068321 A1 | 3/2011 | Pickett et al. | |
| 2014/0022779 A1* | 1/2014 | Su | F21V 9/30 362/231 |
| 2014/0167088 A1 | 6/2014 | Lu | |
| 2014/0252274 A1 | 9/2014 | Masson et al. | |
| 2015/0008393 A1 | 1/2015 | Mangum et al. | |
| 2015/0011029 A1* | 1/2015 | Mangum | C09K 11/02 438/22 |

(Continued)

FOREIGN PATENT DOCUMENTS

| EP | 2599815 A1 | 6/2013 |
|---|---|---|
| JP | 5056998 A1 | 10/2012 |

OTHER PUBLICATIONS

EPO as ISA, "International Search Report and Written Opinion" dated Sep. 20, 2016 from International Application No. PCT/EP2016/065145, filed Jun. 29, 2016, 14 pages.

(Continued)

*Primary Examiner* — Changhyun Yi

(57) ABSTRACT

The present invention relates to a device for emitting light. In one embodiment, an LED has a nano-particle (e.g., quantum dot) coating layer over it for down-converting the light from the LED. The nano-particles are in a dispersion medium for dispersing the nano-particles. The dispersion medium is mixed with a weak acid or a salt thereof. The nano-particles may be coated with silica and the solution is pre-treated with a base or alkali-silanolate to increase the stability of the nano-particles in light conversion.

13 Claims, 5 Drawing Sheets

(56) References Cited

U.S. PATENT DOCUMENTS

2015/0048311 A1* 2/2015 Pickett ................ C09K 11/025
257/14

OTHER PUBLICATIONS

Extended European Search Report dated Dec. 17, 2015 from European Patent Application No. 15175663.2 filed Jul. 7, 2015, 8 pages.

* cited by examiner

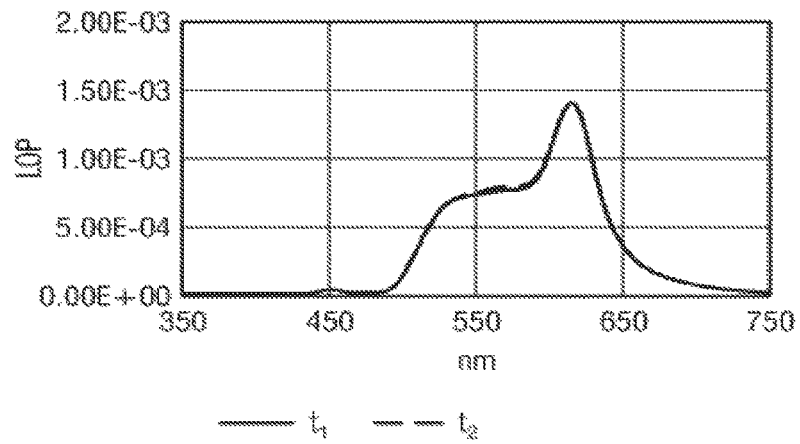
FIG. 7
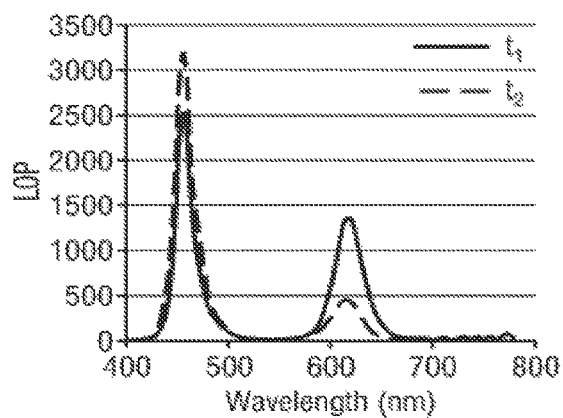 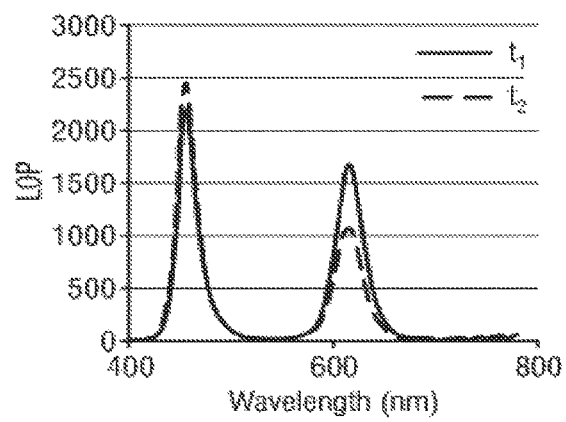
FIG. 8A  FIG. 8B

DEVICE FOR EMITTING LIGHT

CROSS-REFERENCE TO RELATED APPLICATIONS

The present application is a § 371 application of International Application No. PCT/EP2016/065145 filed on Jun. 29, 2016 and titled "DEVICE FOR EMITTING LIGHT," which claims the benefit of European Patent Application No. 15175663.2 filed on Jul. 7, 2015. International Application No. PCT/EP2016/065145 and European Patent Application No. 15175663.2 are incorporated herein.

FIELD OF THE INVENTION

The present invention relates to a device for emitting light. In particular, the present invention relates to light emitting devices based on nano-composites, for instance quantum dot (QD) structures, and finds applications in the field of light emitting diode (LED).

BACKGROUND OF THE INVENTION

Nano-particles such as quantum dots (QD) are a promising phosphor substitute for narrowband red emission leading to an increase in lumen/Watt at high color rendering index. In particular, QDs can be fabricated to have a high photoluminescence quantum yield (PLQY) and may be applicable as down-converting materials in solid state lighting applications. In this way, the performance, efficiency and color choice in lighting applications, particularly light emitting diodes (LEDs), can be improved.

However, in order to apply QDs as a phosphor substitute, it is essential that degradation of the QDs is minimized. In particular, when QDs are applied directly on LEDs and used as a color converter without or only with limited additional encapsulation to protect them against external influences such as moisture, the properties of the QDs will be affected by the moisture leading to degradation of the QDs and consequently a deterioration of the lighting performance.

Different device structures are known in which the stability of QDs in converting light is improved, so that the LEDs comprising QDs as a phosphor substitute may have high lighting performance. However, the stability of light conversion of the QDs cannot be sufficiently improved in such known devices, in particular under high humidity conditions, such as in the case of Wet High Temperature Operating Life (WHTOL) tests.

SUMMARY OF THE INVENTION

It is therefore an object of the present invention to provide a device for emitting light which enables to increase the light conversion stability of nano-particles, in particular quantum dot particles, especially for applications under humid conditions, while maintaining the quantum efficiency of the nano-particles.

In a first aspect of the present invention a device for emitting light is provided that comprises a light generating element for generating light, a coating layer for converting the light generated by the light generating element, the coating layer being dispensed on a top surface of the light generating element, wherein the coating layer comprises a nano-composite including a plurality of nano-particles, a dispersion medium for dispersing the plurality of nano-particles, and a first composition comprising a weak acid or a salt thereof.

In a further aspect of the present invention a method for producing a light emitting device is provided that comprises providing a light generating element for generating light, providing a coating layer for converting the light generated by the light generating element, the coating layer being dispensed on a top surface of the light generating element, wherein the coating layer comprises a nano-composite including a plurality of nano-particles, a dispersion medium for dispersing the plurality of nano-particles, and a first composition comprising a weak acid or a salt thereof.

Preferred embodiments of the invention are defined in the dependent claims. It shall be understood that the claimed method has similar and/or identical preferred embodiments as the claimed device and as defined in the dependent claims.

The light generating element is configured to emit/generate light and can be a semiconductor element comprising a p-n-junction, a diode, a transistor and/or a light emitting diode (LED). The light generating element may preferably be carried by a substrate. The coating layer may comprise a solid layer. Further, the coating layer may be amorphous.

The nano-composite may comprise a quantum dot structure, preferably a silica-shelled quantum dot structure, wherein the nano-particles are preferably quantum dot, quantum rod, tetrapod, or platelet particles. The nano-composite may include one or more hetero-structures based on semiconductor materials, in particular group II-VI materials (e.g. ZnO, ZnS, ZnSe, ZnTe, CdS, CdSe, CdTe, HgS, HgSe, HgTe, etc.), group III-V materials (e.g. GaAs, InAs, GaN, GaP, etc.), group IV-VI materials (e.g. PbSe, PbS, PbTe, etc.), group I-III-VI materials (e.g. $CuGaO_2$, $LiGaO_2$, etc.) or group II-IV-VI materials (e.g. Cd/PbTe, Mg/PbTe, etc.). The nano-composite may comprise one or more nano-crystalline materials.

The nano-particles are configured to convert the light generated by the light generating element from a first wavelength to at least a second wavelength different from the first wavelength. Alternatively or additionally, the nano-particles are configured to convert the light generated by the light generating element from a first wavelength interval to a second wavelength or a second wavelength interval different from the first wavelength interval. In particular, the nano-particles are configured to down-convert the light generated by the light generating element.

The dispersion medium may comprise a polymer composition, preferably a silicone polymer composition. The first composition comprising a weak acid forms an acid composition, preferably an acid solution or an acid fluid, further preferably a solution of a benzoic acid. Alternatively, other acids such as acids that form the end group of a polydimethylsiloxane (PDMS) chain, carboxylic acids such as carboxydecyl-terminated carboxylic acids and/or carboxydecyl-terminated polydimethylsilioxane, may also be used, wherein such acids are understood as or comprise acid substituted PDMS, polyphenylmethylsilcone or phenylsilicone.

For the scope of the present invention, "weak acids" are acids whose pKa value, once measured under ambient conditions (room temperature of about 25° C. and about 1 bar of air pressure), lies between 3.5 and 5. The acid fluid may be in the liquid phase or a vapour phase. Alternatively, the first composition may comprise a salt of the weak acid, preferably potassium benzoate, caesium benzoate, lithium benzoate, calcium benzoate and/or sodium benzoate.

Advantageously, the acid composition achieves the effect of maintaining the physical and chemical properties of the nano-particles, leading to higher stability of the nano-particles in light conversion at elevated operating temperatures, for instance as high as 85° C. Further, the acid composition also prevents or at least reduces the degradation of the nano-particles, in particular the quantum dot particles, under humid operating conditions. The degradation rate measured in Wet High Temperature Operating Life (WHTOL) tests can be advantageously reduced by a factor of 2 to 3. The use of weak acids serves to avoid dissolution of silica shells of the nano-composite, in particular the silica-shelled quantum dot structure, due to extreme low pH values, since the solubility of silica depends on the pH value of the solvent. Further, the use of such acids also avoids very high pH values that may occur after a base pretreatment and at which silica may dissolve.

In a preferable embodiment, the coating layer is formed by dispersing the plurality of nano-particles in the dispersion medium prior to mixing the dispersion medium with the acid composition. In this way, the nano-particles are distributed all over the dispersion medium without chemical reaction with the dispersion medium, so that the physical and chemical properties of the nano-particles are advantageously maintained. In case of quantum dot particles, a quantum dot dispersion can be formed in this way. Prior to the addition of the first composition, the first composition may be dissolved in a solvent that is chemically compatible with the dispersion medium.

In another preferable embodiment, the coating layer is formed by mixing the dispersion medium with the acid composition prior to dispensing the nano-composite on the dispersion medium. In this way, a mixture of acid and dispersion medium, in particular an acid-silicone mixture, can be formed.

In another preferable embodiment, the acid solution is dissolved in a solvent chemically compatible with the dispersion medium, solvent comprising toluene, butyl-acetate, tert-butylacetate and/or THF. In this way, the acid solution does not chemically react with the dispersion medium, so that the chemical properties of the acid solution and the dispersion medium are maintained. Advantageously, the stability of the nano-composite in light conversion is further increased. The acid composition does not necessarily but can include the solvent.

The device further comprises a second composition comprising a base composition and/or a silanolate. The base composition and/or the silanolate advantageously further increases the stability of the nano-particles in light conversion. The base composition may comprise a base alcohol solution or a solution of a strong base such as KOH, NaOH, CsOH, LiOH and/or CaOH. The silanolate preferably comprises an alkali-silanolate, more preferably potassium silanolate, sodium silanolate, caesium silanolate, lithium silanolate and/or calcium silanolate. The plurality of nano-particles are preferably mixed with the base composition and/or the alkali-silanolate.

In another preferable embodiment, the coating layer comprises a first layer and a second layer, the first layer being dispensed on the top surface of the light generating element, the second layer being dispensed on the first layer. Advantageously, a dual layer dispensed system is prepared in this way, leading to increased solid state lighting functionalities. Preferably, the first layer comprises the dispersion medium and the acid composition, wherein the second layer may comprise the plurality of nano-particles. In this case, the dispersion medium does not serve to disperse the nano-particles. A drawback of adding an acid is that the degradation under ambient conditions may be compromised. This can be addressed by spatially separating the layer containing the acid and the layer containing the quantum dots.

BRIEF DESCRIPTION OF THE DRAWINGS

These and other aspects of the invention will be apparent from and elucidated with reference to the embodiment(s) described hereinafter. In the following drawings

FIG. 7 shows a diagram of the light output power (LOP) as a function of the wavelength of output light using an LED sample fabricated involving treatment of quantum dot particles with an acid solution;

FIG. 8A shows a diagram of the light output power (LOP) as a function of the wavelength of output light using an LED sample fabricated involving treatment of quantum dot particles with an acid solution;

FIG. 8B shows schematically a diagram of LOP as a function of the wavelength of the output light of another LED sample fabricated without treatment of quantum dot particles with an acid solution;

DETAILED DESCRIPTION OF THE INVENTION

Nano-composites, in particular quantum dot (QD) structures, can be fabricated to show high photoluminescence quantum yield (PLQY). Such materials may therefore be applicable as down-converting materials for solid state lighting applications. In such applications, the nano-particles, in particular the quantum dot particles absorb light of a particular wavelength, preferably blue light, and then emit light at another wavelength, preferably red or green.

The light conversion properties of quantum dot (QD) particles, in particular silica-shelled QD particles, can be stabilized by modifying the properties of the silica-shell. The stabilization works well if the QD particles are used on an LED under dry operating conditions. However, at high humidity, as is the case in a standard Wet High Temperature Operating Life (WHTOL) test, the QD particles degrade quickly.

The reason for this is that QD particles are sensitive to oxygen and water, especially if they are exposed to light. To reduce oxygen and water sensitivity, surface modifications and coatings can be applied. For applications under ambient (atmospheric) conditions, it is useful to coat the QD particles with a shell made of silica, leading to silica-shelled QD particles. This approach is often used for diagnostic applications where the QD particles are exposed to an aqueous environment. For applications on an LED in air, in a silicone matrix where the QD particles are exposed to high temperatures and light flux, the silica shell alone is not sufficient to maintain high quantum efficiency under operating conditions.

Figure 1A:
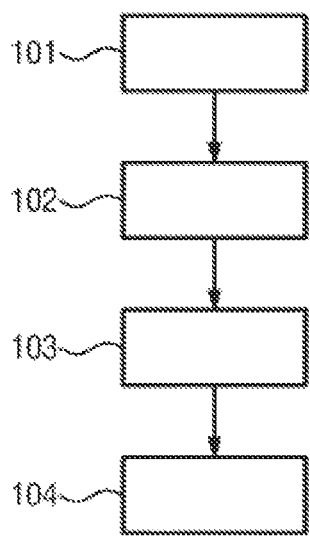
FIG. 1A shows a schematic block diagram of a method for producing a light emitting device.

FIG. 1A shows a schematic block diagram of a method for producing a device for emitting light. The method comprises providing a nano-composite including a plurality of nano-particles, providing a dispersion medium for dispersing the plurality of nano-particles and providing an acid composition (step 101). Preferably, the method comprises pretreating the nano-composite with a base composition and/or an alkali-silanolate (step 102). Further, the method comprises dispersing the plurality of nano-particles in the dispersion medium (step 103) and subsequently mixing the dispersion medium with the acid composition (step 104).

Figure 1B:
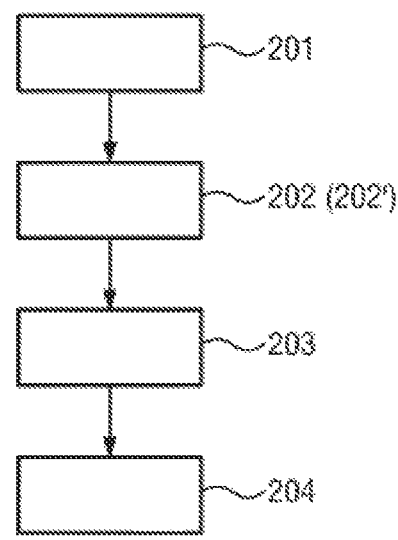
FIG. 1B shows a schematic block diagram of another method for producing a light emitting device.

FIG. 1B shows a schematic block diagram of another method for producing a device for emitting light. The method comprises a first step (step 201) which is essentially the same as step 101 shown in FIG. 1A. The method of FIG. 1B comprises further mixing the dispersion medium with the acid composition (step 202). Preferably, the method also comprises pretreating the nano-composite with a base composition and/or an alkali-silanolate (step 202'). Preferably, the method comprises dispensing the dispersion medium mixed with the acid composition on an LED (step 203). In addition, the method comprises dispensing the nano-composite, preferably pretreated with the base composition and/or the alkali-silanolate, on the dispersion medium mixed with the acid composition (step 204), which is preferably already dispensed on the LED.

The use of the acid composition reduces the degradation of the nano-particles, in particular the QD particles, under humid conditions. In particular, the acid composition may be a solution of a weak acid such as benzoic acid solution, a stearic acid solution, a solution containing polydimethylsiloxane (PDMS) and/or carboxydecyldimethyl, wherein the acid solution is mixed with the silicone. Additional examples for the acid solution may be PDMS with carboxydecyl endgroups, which is chemically connected to PDMS, as well as carboxylated PDMS, wherein additional means may be needed to maintain the carboxlated PDMS during the curing process. Preferably, at least one of these additional examples of acid solution is used with dimethylsilicone, silicones of the phenyl or methyl-phenyl type, and/or methylphenyl silicones with a carboxylic acid end group. Alternatively or additionally to the carboxylic acid end group, a carboxylic group as part of a side group in the chain may also be used. Advantageously, the present method improves the nano-particles, in particular the silica-shelled QD particles, in WHTOL.

Preferably, the pretreating of the nano-composite with the base composition comprises enabling the base composition to react with a silicone polymer composition. In this way, exposure of the base alcohol solution to the nano-particles, in particular to the quantum dot particles, is minimized, which advantageously further increases the stability of the nano-composite. Further preferably, the pretreating of the nano-composite further comprises heating the plurality of nano-particles. This advantageously increases the rate of solution of the nano-particles in the base composition and/or in the alkali-silanolate. It is important that the base can reach the quantum dot particles. Pretreating the silicone with base alcohol solution has the advantage that the reaction product, in particular an alkali-silanolate, serves as the base and is easily homogeneously mixed with the quantum dot particles. In this way, the pretreatment is more homogeneous compared to phase separating system when water or alcohols are used. In addition, hydrogen evolution now only occurs in the first step, modifying the silicone and the reaction product that has served as a base can be removed in a centrifugation step. This is advantageous as excess base having not reacted with the silica is removed and the silicone having reacted is not useful in the crosslinking of the silicone.

The pretreating of the nano-composite may further comprise washing the heated nano-composite with an organic solvent, the organic solvent preferably comprising or being formed of toluene and/or cyclohexane. In this way, the nano-particles are more thoroughly dissolved in the base composition and/or the alkali-silanolate. This also removes the excess silanolate that is no longer actively bound to the surface of the nano-particles, in particular the surface of the quantum dot particles. There should not be any excess silanolate that can later cause degradation of the silicone polymer in the LED device.

In a further preferable embodiment, the method further comprises adding a phosphor composition to the nano-composite. This increases the down-converting function of the nano-composite, in particular for producing white light, If red emitting quantum dots are used, the phosphor composition may preferable comprise yellow phosphor (NYAG). In still a further preferable embodiment, the method further comprises thermal curing. In this way, the thermal and mechanical stability of the nano-particles dispersed in the dispersion medium and/or the chemical and mechanical stability of the dispersion medium mixed with the acid solution can be advantageously increased.

Figure 2A:
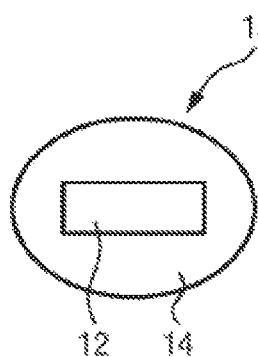
FIG. 2A shows schematically a silica-shelled quantum dot structure.

FIG. 2A shows schematically a QD structure 12 coated by a shell 14 made of silica, thereby forming a silica-shelled QD structure 15. Pretreating the silica-shelled QD structure with a base composition, in particular a solution of a strong base such as KOH, NaOH, CsOH, etc., leads to partial transformation of the silica to an alkali-silicate. In the case of KOH, potassium silicate can be formed; in a case of NaOH, a sodium silicate can be formed.

Figure 2B:
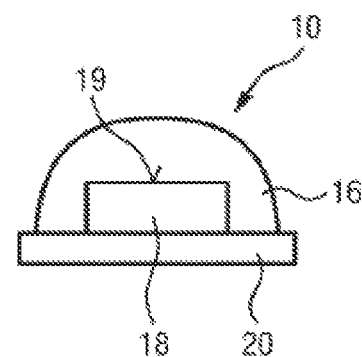
FIG. 2B shows schematically a light emitting device.

FIG. 2B shows a first embodiment of a device 10 for emitting light, comprising a light generating element 18 for generating light and a coating layer 16 for converting the light generated by the light generating element 18. The light generating element 18 is preferably a light emitting diode (LED) and is further preferably carried on a substrate 20. The coating layer 16 is dispensed on a top surface 19 of the light generating element 18. The coating layer 16 comprises a nano-composite including a plurality of nano-particles, a dispersion medium for dispersing the nano-particles, and an acid composition. The coating layer 16 is preferably formed by dispersing the plurality of nano-particles in the dispersion medium prior to mixing the dispersion medium with the acid composition.

Figure 2C:
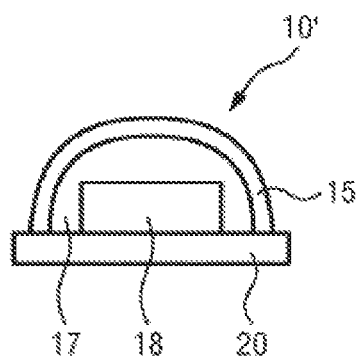
FIG. 2C shows schematically another light emitting device.

FIG. 2C shows a second embodiment of a device 10' for emitting light, which is similar to the embodiment shown in FIG. 2B, except that the coating layer is formed by mixing the dispersion medium with the acid composition prior to dispensing the nano-composite on the dispersion medium. Preferably, the coating layer in FIG. 2C is formed as a dual layer dispensed system comprising a first layer 17 and a second layer 21. The first layer 17 is preferably dispensed on the top surface 19 of the light generating element 18, the second layer 21 being dispensed on the first layer 17. The first layer 17 may comprise the dispersion medium such as silicone and the acid composition. The second layer may comprise a plurality of nano-particles, in particular quantum dot particles.

In the preparation process of the alkali-silicates, the exposure of the base alcohol solution to the nano-particles, in particular to the quantum dot particles, should be minimized. One way to achieve this is to enable the base solution to react with a silicone polymer composition. In particular, the pretreating of the silica-shelled QD structure 15 with the base solution preferably comprises enabling the alkali base solution, which is further preferably dissolved in methanol with high concentration of alkali base, to react with silicone. In this case, alkali-silanolate can be formed that can subsequently react with the silica shell 14. In the case of KOH, potassium silanolates are formed; in a case of NaOH, sodium silanolates are formed.

Alternatively, the QD structure 12, preferably the silica-shelled QD structure 15 can be pretreated with an alkali-silanolate directly in order to minimize exposure to water. The alkali-silanolate may preferably comprise K—O—Si—($CH_3$), preferably a solution, for instance using tetrahydrofuran (THF) as a solvent.

Pretreating the silica-shelled QD structures with a base solution also improves the property of the QD structure in high temperature operating life (HTOL), as shown for instance in US 2014/0252274 A. After pretreating with the base solution and/or the alkali-silanolate, the silica-shelled QD structure 15, which is now accompanied with an alkali-silicate and/or the silica shell 14, can be dispersed in the dispersion medium, preferably comprising a polymer composition such as a silicone polymer composition, as described in FIG. 1A (step 103). Subsequently, the dispersion medium can be mixed with an acid solution, thereby forming the coating layer 16 (step 104). As shown in FIG. 2B, the coating layer 16 can be dispensed on a surface 19 of an LED 18, which is preferably carried by a substrate 20.

Alternatively, the acid solution can be added to the dispersion medium, in particular the silicone, separately to form the first layer 17 (step 202 in FIG. 1B). The first layer 17 can be first dispensed on the LED 18 carried by the substrate 20, prior to dispensing the second layer of QD particles pretreated with the base solution and/or the alkali-silanolate on the first layer 17 (step 204 in FIG. 1B).

There exist different methods to pretreat the nano-composite, in particular the silica-shelled QD structure 15, with the base solution and/or the alkali-silanolate. In the following, three methods are exemplarily described.

Method 1

The base solution is prepared by mixing 5 g of silicone (e.g. of the product number "Dow CORNING 6630B" from the manufacturer "Dow Corning") with 1 g of a 3M KOH solution, wherein the KOH is dissolved in methanol, and additionally with 1.5 g of toluene. The units "M" means mol/L. The mixture formed in this way is kept at 150° C. for 30 min to allow the reaction between the KOH and the silicone to occur. Subsequently, 0.15 g of the reaction product was added to 0.2 g of a solution of QD particles using toluene and silicone as solvents, wherein the concentration of the QD particles is 10 wt. %. Then, heat treatment is performed at 150° C. for 30 min. After the last heat treatment, the mixture is washed with toluene. In this way, the silica-shelled QD structure is pretreated with KOH.

Method 2

0.06 g of a 1 M solution of potassium silanolate is mixed with a QD structure, preferably a silica-shelled QD structure, to which a certain amount of silicone, preferably 0.1 g. The mixture out of potassium silanolate and QD particles is kept at 150° C. for 30 min for heat treatment, before the QD particles are washed. In this way, the QD structure, preferably the silica-shelled QD structure, is pretreated with potassium silanolate.

Method 3

50 μL of a 0.8 M NaOH solution is added to 100 μL of water. Then, a QD structure, in particular a silica-shelled QD structure, is added to the NaOH solution, wherein the QD particles are dissolved in toluene, wherein 0.6 mL of a 4 wt % QD solution is used. The new mixture is then stirred for 2 h and subsequently washed with a reverse micelle system which has been prepared using 10 mL of cyclohexane and 1.27 g of Igepal-CO-520. The use of the reverse micelle is advantageous for minimizing the amount of water in the new mixture. After the washing, the mixture is centrifuged and subsequently washed for the second time with toluene. In this way, the QD structure, preferably the silica-shelled QD structure, is pretreated with the NaOH solution.

The QD particles pretreated with the base composition and/or the alkali-silanolate, for instance using one of the methods 1-3, is then dispersed in a dispersion medium, in particular silicone, thereby forming a QD dispersion, as shown in FIG. 1A (step 103). Then, an acid solution, for instance a benzoic acid solution dissolved in toluene is added to the QD dispersion, before the new mixture is mixed using a vortex test tube mixer. In this way, the coating layer 16 is formed. Yellow phosphor (NYAG) may be additionally mixed into the QD dispersion in case the device is configured to emit light from the white spectrum.

Alternatively, the acid solution can be first mixed with the dispersion medium, in particular the silicone, separately to form the first layer 17, preferably an acid-silicone layer. After the first layer 17 has been dispensed on the light generating element 18, particularly an LED, the QD particles pretreated with the base solution and/or the alkalisilanolate can be dispensed as a second layer 21 on the first layer 17. Also in this case, yellow phosphor (NYAG) may be added into the QD particles in case white LEDs are to be prepared, so that the second layer 21 contains yellow phosphor.

In FIGS. 3 to 9, experimental results using LED samples involving treatment with acid solutions and without treatment using acid solutions are shown. For FIGS. 3, 4, 5, 6, 8, 9, a certain volume (preferably about 4 μL) of the QD dispersion has been prepared using one of the methods 1, 2, 3, wherein the QD dispersion has been dispensed on an LED. The LED sample formed in this way has then been thermally cured using the following curing steps: in a first curing step, the LED sample is kept at 160° C. for 15 min; in a second curing step following the first curing step, the LED sample is kept at 90° C. for 15 min; in a third curing step following the second curing step, the LED sample is kept at 150° C. for 2 h.

For FIG. 7, an acid-silicone mixture layer has first been formed and dispensed on an LED, followed by thermal curing using the afore-mentioned curing steps. Subsequently, a second layer of QD particles pretreated with KOH and mixed with yellow phosphor has been dispensed on the first layer of acid-silicone mixture.

In the following, the FIGS. 3 to 9 are described in more detail.

Figure 3A:
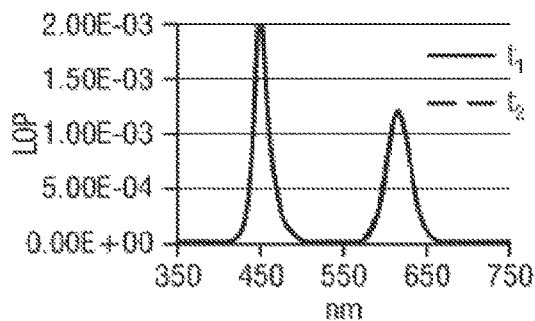
FIG. 3A shows a diagram of the light output power (LOP) as a function of the wavelength of output light using an LED sample fabricated involving treatment of quantum dot particles with an acid solution.

Sample 3-1 has been used for obtaining the diagram shown in FIG. 3A. The fabrication of sample 3-1 involves pretreating the silica-shelled QD structure with a base solution according to method 1 and mixing the QD dispersion with a benzoic acid solution. Then, the new mixture was dispensed as a layer on an LED before performing the thermal curing as described above.

Sample 3-2 has been used for obtaining the diagrams shown in 3B. The fabrication of sample 3-2 is essentially the same as that of a sample 3-1 for FIG. 3A, except that the QD particles pretreated with the base solution has not been mixed with the acid solution, but directly dispensed as a layer on the LED prior to thermal curing.

Both samples 3-1 and 3-2 have been tested under a temperature of 85° C. and 85% humidity. The light output power has been measured as a function of wavelength of the output light for both samples. A first measurement (solid curve) has been performed at an initial time point $t_1=0$ h and a second measurement (dashed curve) has been performed at another time point $t_2=380$ h which was 380 hours later than $t_1$. In particular, the initial time point $t_1$ marks the beginning of the WHTOL, wherein the other time point $t_2$ marks the duration of the measurement condition used for WHTOL.

Figure 3B:
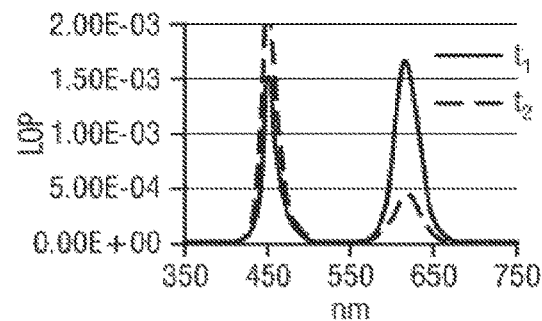
FIG. 3B shows schematically a diagram of LOP as a function of the wavelength of the output light of another LED sample fabricated without treatment of quantum dot particles with an acid solution.

As can be seen in FIG. 3A, the two curves measured at $t_1$ and $t_2$ essentially overlap each other, indicating that the LOP of sample 3-1 essentially does not show degradation of the QD particles. FIG. 3B shows two signal peaks each centered at an output wavelength. As can be clearly seen from FIG. 3B, sample 3-2 shows different output powers for the output wavelengths measured at $t_2$ from that measured at $t_1$, indicating significant change/degradation after WHTOL.

Figure 4A:
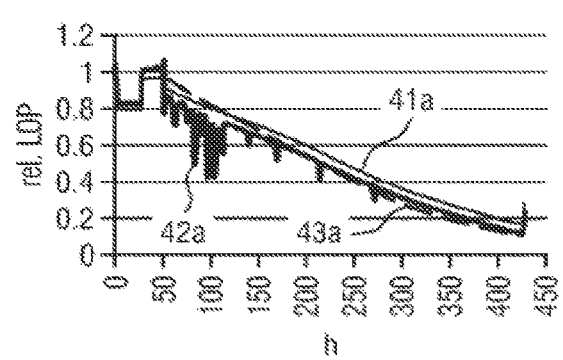
FIG. 4A shows schematically a diagram of the relative LOP of three LED samples as function of time, wherein the LED samples are fabricated without treatment of quantum dot particles with an acid solution.

FIG. 4A shows a diagram of the relative light output power (rel. LOP) as a function of time measured in hours (h) for three LED samples: curve 41a for sample 4-1a, curve 42a for sample 4-2a and curve 43a for sample 4-3a. All the three samples have been fabricated without involving mixing with an acid solution. The spectra are measured using an integrating sphere, measuring all the light emitted from the LED. The traces during the WHTOL test are measured using a fiber optic placed at an angle above the LED. Therefore, the emitted light is not fully captured, which is the reason for using the term "rel. LOP". Alternatively, the term "measured output or signal intensity" may be used instead.

Figure 4B:
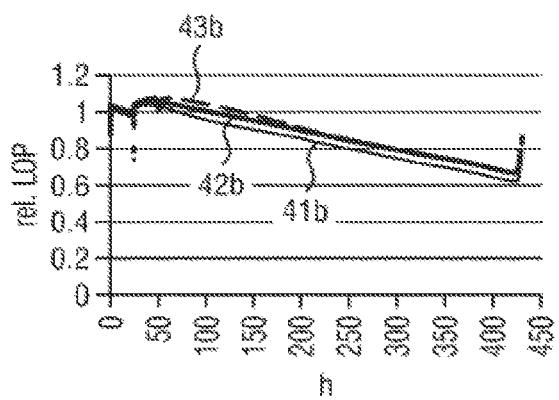
FIG. 4B shows schematically a diagram of the relative LOP as a function of time for three LED samples, wherein the LED samples are fabricated involving treatment of quantum dot particles with a benzoic acid solution.

FIG. 4B shows a diagram of the rel. LOP as a function of time (h) measured for three samples: curve 41b for sample 4-1b, curve 42b for sample 4-2b and curve 43b for sample 4-3b, wherein all the three samples of FIG. 4B have been fabricated involving mixing with a benzoic acid solution.

Figure 4C:
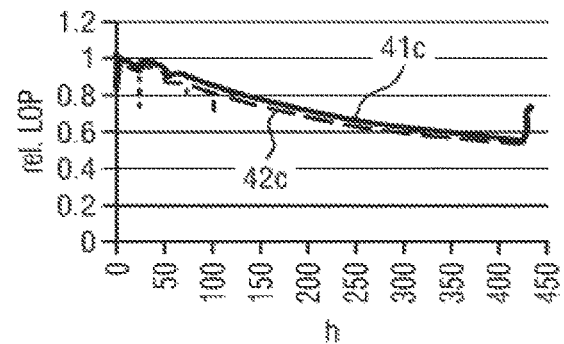
FIG. 4C shows schematically a diagram of the relative LOP as a function of time for three LED samples, wherein the LED samples are fabricated involving treatment of quantum dot particles with an acid solution different from that used for FIG. 4B.

FIG. 4C shows a diagram of the rel. LOP as a function of time (h) measured for two samples: curve 41c for sample 4-1c and curve 42c for sample 4-2c, wherein all samples have been fabricated involving mixing with carboxymethyl-terminated polydimethylsiloxane.

In all measurements, the respective LED sample has been switched on and then off once every hour. The measurement results are shown in FIG. 4A-C, wherein the humidity has been increased stepwise. In particular, the humidity has been increased from 5% to 30% at t=24 h and finally to 85% at 85° C. at t=48 h, corresponding to the initial part of the diagrams of FIG. 4A-C. As shown in FIG. 4A, the slope measured in situ is particularly strong at t=24 h and at t=48 h, compared to the slope of the curves shown in FIG. 4B and FIG. 4C. This means that samples fabricated without involving mixing with an acid solution (as for FIG. 4A) show significantly stronger reaction to an increase in humidity than samples fabricated involving mixing with an acid solution (as for FIG. 4B, C). Consequently, the dependence of the emission properties of the QD particles on moisture is significantly reduced by involving mixing with an acid solution in the fabrication of the LED sample.

Figure 5A:
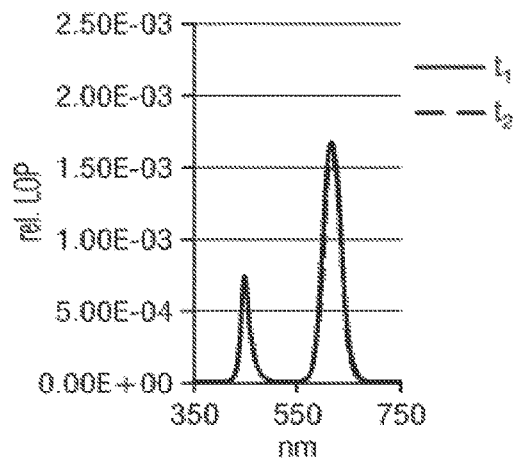
FIG. 5A shows a diagram of the light output power (LOP) as a function of the wavelength of output light using an LED sample fabricated involving treatment of quantum dot particles with an acid solution.

Sample 5-1 has been used for obtaining the diagram shown in FIG. 5A. The fabrication of sample 5-1 involves pretreating the silica-shelled QD structure with a base solution according to method 1 and mixing 0.4 mL of the obtained QD dispersion with 20 μL of a 10% benzoic acid solution in toluene. Then, the new mixture was dispensed as a layer on an LED before performing the thermal curing as described above.

Sample 5-2 has been used for obtaining the diagrams shown in 5B. The fabrication of sample 5-2 is essentially the same as that of a sample 5-1 for FIG. 5A, except that the QD particles pretreated with the base solution has not been mixed with the acid solution, but directly dispensed as a layer on the LED prior to thermal curing.

The light output power has been measured as a function of wavelength of the output light for both LED samples 5-1 and 5-2, respectively. At a first time point $t_1=0$ h, a first measurement has been performed for each sample by taking initial spectra using an integrating sphere driving the LED samples 5-1 and 5-2 at 120 mA. Subsequently, both samples 5-1 and 5-2 have been placed in a test chamber with a temperature of 85° C. and a humidity level of 85%. At a second time point $t_2=500$ h, both samples 5-1 and 5-2 have been taken out from the test chamber to perform a second measurement (dashed curve) under the same measurement conditions as in the first measurement. The initial time point $t_1$ marks the beginning of the WHTOL, wherein the other time point $t_2$ marks the duration of the measurement condition for WHTOL. During the time interval between $t_1$ and $t_2$, the respective LED sample 5-1 and 5-2 has been switched on and then off once every hour.

Figure 5B:
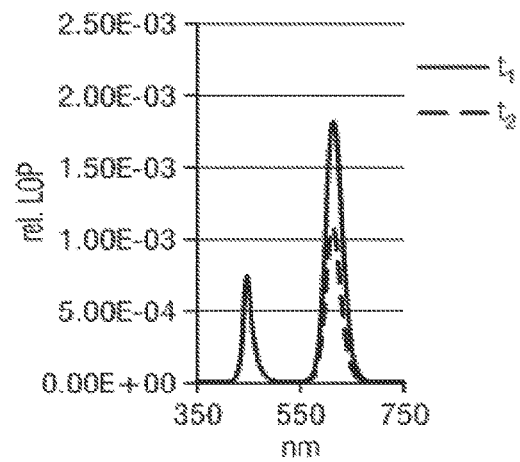
FIG. 5B shows schematically a diagram of LOP as a function of the wavelength of the output light of another LED sample fabricated without treatment of quantum dot particles with an acid solution.

As can be seen in FIG. 5A, the two curves measured at $t_1$ and $t_2$ essentially overlap each other for sample 5-1. FIG. 5B shows two signal peaks each centered at an output wavelength. As can be clearly seen from FIG. 5B, sample 5-2 shows different output powers for the larger one of the two output wavelengths measured at $t_2$ from that measured at $t_1$, indicating significant change/degradation after WHTOL.

Figure 6A:
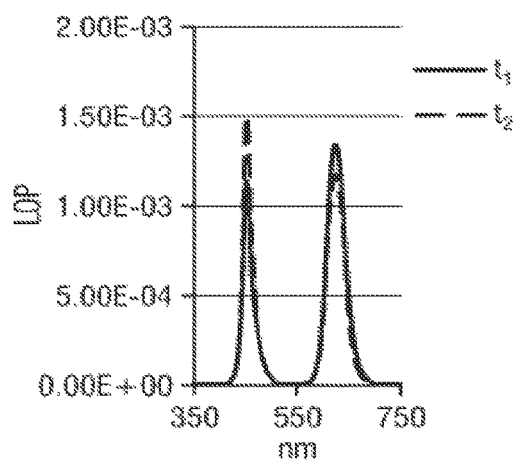
FIG. 6A shows a diagram of the light output power (LOP) as a function of the wavelength of output light using an LED sample fabricated involving treatment of quantum dot particles with an acid solution.

Sample 6-1 has been used for obtaining the diagram shown in FIG. 6A. The fabrication of sample 6-1 involves pretreating the silica-shelled QD structure with a base solution according to method 1 and mixing 0.4 mL of the obtained QD dispersion with 50 µL of a 10% benzoic acid solution in toluene. Then, the new mixture was dispensed as a layer on an LED before performing the thermal curing as described above.

Sample 6-2 has been used for obtaining the diagrams shown in 6B. The fabrication of sample 6-2 is essentially the same as that of a sample 6-1 for FIG. 6A, except that the QD particles pretreated with the base solution has not been mixed with the acid solution, but directly dispensed as a layer on the LED prior to thermal curing.

The light output power has been measured as a function of wavelength of the output light for both LED samples 6-1 and 6-2, respectively. At a first time point $t_1$=0 h, a first measurement has been performed for each sample by taking initial spectra using an integrating sphere driving the LED samples 6-1 and 6-2 at 120 mA. Subsequently, both samples 6-1 and 6-2 have been placed in a test chamber with a temperature of 85° C. and a humidity level of 85%. At a second time point $t_2$=700 h, both samples 6-1 and 6-2 have been taken out from the test chamber to perform a second measurement (dashed curve) under the same measurement conditions as in the first measurement. The initial time point $t_1$ marks the beginning of the WHTOL, wherein the other time point $t_2$ marks the duration of the measurement condition for WHTOL. During the time interval between $t_1$ and $t_2$, the respective LED sample 6-1 and 6-2 has been switched on and then off once every hour.

Figure 6B:
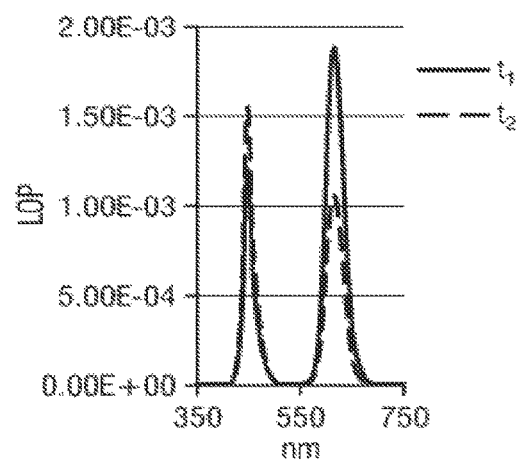
FIG. 6B shows schematically a diagram of LOP as a function of the wavelength of the output light of another LED sample fabricated without treatment of quantum dot particles with an acid solution.

FIG. 6A shows two signal peaks each centered at an output wavelength. FIG. 6B shows two signal peaks centered at the same output wavelengths as in FIG. 6A. As can be clearly seen from FIGS. 6A,B, sample 6-2 shows larger differences between output powers measured at $t_2$ and those measured at $t_1$ compared to sample 6-1. This indicates that sample 6-2 shows significant change/degradation after WHTOL.

Sample 7 has been used for obtaining the diagram shown in FIG. 7. The fabrication of sample 7 involves pretreating the silica-shelled QD structure with a KOH solution according to method 1, wherein an amount of yellow phosphor has been mixed to the pretreated QD particles. 5 µL of an acid-silicone mixture containing 5% benzoic acid and 20% silicone dissolved in toluene has been dispensed on an LED as a first layer. Then, LED covered by the acid-silicone mixture layer has been thermally cured as described above. Subsequently, a second layer of the pretreated QD particles mixed with yellow phosphor has been dispensed on the benzoic acid-silicone mixture underlayer. In this way, sample 7 is formed as a dual layer dispensed system.

The light output power has been measured as a function of wavelength of the output light for sample 7. At a first time point $t_1$=0 h, a first measurement has been performed for each sample by taking initial spectra using an integrating sphere driving the LED sample 7 at 120 mA. Subsequently, sample 7 has been placed in a test chamber with a temperature of 85° C. and a humidity level of 85%. At a second time point $t_2$=800 h, sample 7 has been taken out from the test chamber to perform a second measurement (dashed curve) under the same measurement conditions as in the first measurement. The initial time point $t_1$ marks the beginning of the WHTOL, wherein the other time point $t_2$ marks the duration of the measurement condition for WHTOL. During the time interval between $t_1$ and $t_2$, sample 7 has been switched on and then off once every hour.

As can be seen in FIG. 7, the two curves measured at $t_1$ and $t_2$ essentially overlap each other, indicating that the LOP of sample 7 essentially does not show degradation of the QD particles. HTOL characteristics were not compromised, meaning that sample degradation after HTOL was the same and very low for sample 7. This is the case if the benzoic acid is in the same layer, except at very low concentrations of the acid. In the dual layer system, HTOL is not compromised. Further, degradation under ambient conditions is the same as for a system without the use of benzoic acid.

Sample 8-1 has been used for obtaining the diagram shown in FIG. 8A. The fabrication of sample 8-1 involves pretreating the silica-shelled QD structure with a NaOH solution according to method 3 and mixing 200 µL of the obtained QD dispersion with 10 µL of a 10% benzoic acid solution in toluene. Then, the new mixture was dispensed as a layer on an LED before performing the thermal curing as described above.

Sample 8-2 has been used for obtaining the diagrams shown in 8B. The fabrication of sample 8-2 is essentially the same as that of a sample 8-1 for FIG. 8A, except that the QD particles pretreated with the base solution has not been mixed with the acid solution, but directly dispensed as a layer on the LED prior to thermal curing.

The light output power has been measured as a function of wavelength of the output light for both LED samples 8-1 and 8-2, respectively. At a first time point $t_1$=0 h, a first measurement has been performed for each sample by taking initial spectra using an integrating sphere driving the LED samples 8-1 and 8-2 at 120 mA. Subsequently, both samples 8-1 and 8-2 have been placed in a test chamber with a temperature of 85° C. and a humidity level of 85%. At a second time point $t_2$=800 h, both samples 8-1 and 8-2 have been taken out from the test chamber to perform a second measurement (dashed curve) under the same measurement conditions as in the first measurement. The initial time point $t_1$ marks the beginning of the WHTOL, wherein the other time point $t_2$ marks the duration of the measurement condition for WHTOL. During the time interval between $t_1$ and $t_2$, the respective LED sample 8-1 and 8-2 has been switched on and then off once every hour.

As can be seen in FIG. 8A-B, the LOP measured for red light wavelength (600 nm~650 nm) at $t_2$ is smaller than that measured at $t_1$ by a smaller amount for sample 8-1 than for sample 8-2. Sample 8-1 shows therefore less degradation after WHTOL than sample 8-2.

Figure 9A:
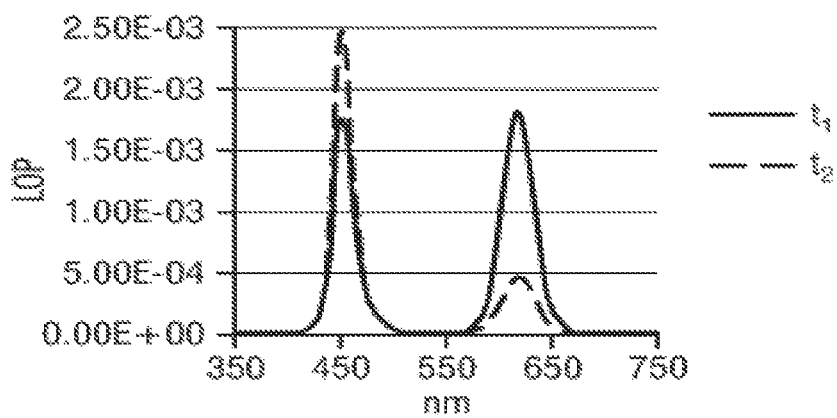
FIG. 9A shows schematically a diagram of the relative LOP as function of wavelength of output light using an LED sample fabricated without treatment of quantum dot particles with an acid solution.

Sample 9-1 has been used for obtaining the diagram shown in FIG. 9A. The fabrication of sample 9-1 involves pretreating the silica-shelled QD structure with a base solution according to method 1 and mixing 0.2 g of the obtained QD dispersion with 50 µL of a 10% stearic acid solution in toluene. Then, the new mixture was dispensed as a layer on an LED before performing the thermal curing as described above Sample 9-2 has been used for obtaining the diagrams shown in 9B. The fabrication of sample 9-2 is essentially the same as that of a sample 9-1 for FIG. 9A, except that 7 μL of a carboxydecyldimethyl-terminated polydimethylsiloxane solution has been used instead of stearic acid solution and a dimethylsilicone was used.

Sample 9-3 has been used for obtaining the diagrams shown in 9C. The fabrication of sample 9-3 is essentially the same as that of a sample 9-1 for FIG. 9A, except that the QD particles pretreated with the base solution has not been mixed with the acid solution, but directly dispensed as a layer on the LED prior to thermal curing.

The light output power has been measured as a function of wavelength of the output light for all three LED samples 9-1, 9-2 and 9-3, respectively. At a first time point $t_1=0$ h, a first measurement has been performed for each sample by taking initial spectra using an integrating sphere driving the LED samples 9-1,2,3 at 120 mA. Subsequently, all three samples 9-1,2,3 have been placed in a test chamber with a temperature of 85° C. and a humidity level of 85%. At a second time point $t_2=300$ h, all three samples 9-1,2,3 have been taken out from the test chamber to perform a second measurement (dashed curve) under the same measurement conditions as in the first measurement. The initial time point $t_1$ marks the beginning of the WHTOL, wherein the other time point $t_2$ marks the duration of the measurement condition for WHTOL. During the time interval between $t_1$ and $t_2$, the respective LED sample 9-1,2,3 has been switched on and then off once every hour.

Figure 9B:
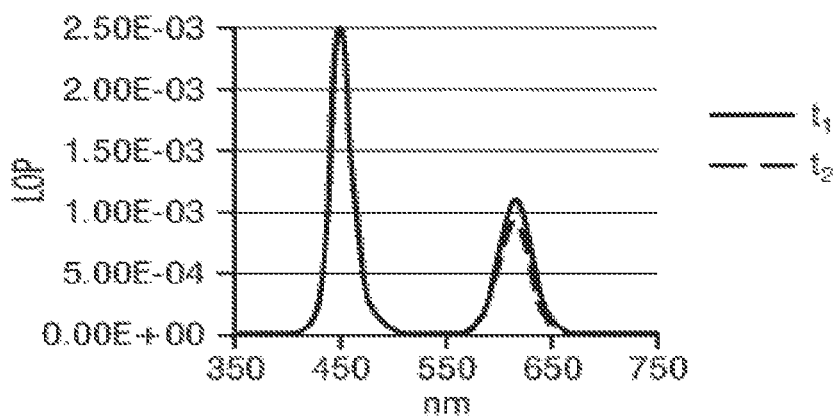
FIG. 9B shows schematically a diagram of the relative LOP as function of wavelength of output light using another LED sample fabricated involving treatment of quantum dot particles with a benzoic acid solution.
Figure 9C:
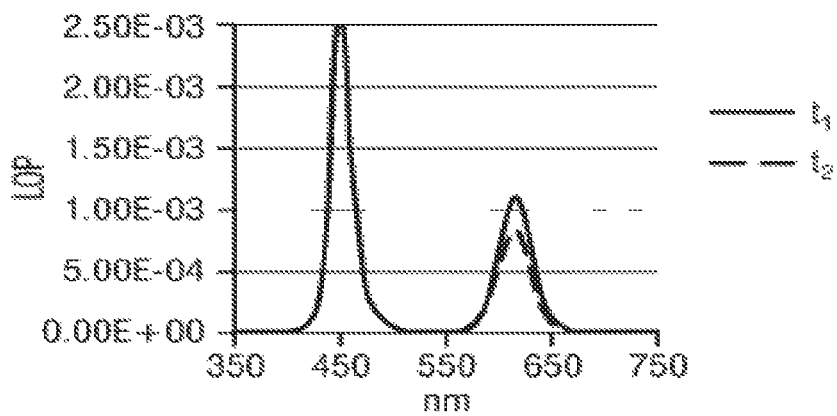
FIG. 9C shows schematically a diagram of the relative LOP as function of wavelength of output light using a further LED sample fabricated involving treatment of quantum dot particles with an acid solution other than the benzoic acid solution.

As can be seen in FIG. 9A-B, the two curves measured at $t_1$ and $t_2$ essentially overlap for samples 9-1 and 9-2. In contrast, as can be seen in FIG. 9C, the LOP measured at the output wavelengths of approximately 450 nm and 620 nm at $t_2$ is significantly lower than that measured at $t_1$ for sample 9-3. Samples 9-1 and 9-2 hence show less degradation after WHTOL than sample 9-3.

The above-mentioned measurements show that the acid solution used to treat the QD structure enables to prevent the dissolution of the reaction product of the pretreating process with base solution and/or alkali-silanolate.

In a further embodiment, a potassium-silanolate solution was prepared as in method 1 by mixing 5 g of silicone (e.g. of the product number "Dow CORNING 6630B" from the manufacturer "Dow Corning") with 1 g of a 3M KOH solution, wherein the KOH is dissolved in methanol, and additionally with 1.5 g of toluene. The unit "M" means mol/L. The mixture formed in this way is kept at 150° C. for 30 min to allow the reaction between the KOH and the silicone to occur. To 30 mg of this mixture, 34 mg of a 5% benzoic acid solution in toluene was added and stirred for 10 minutes. The resulting solution was added to 0.6 g of a 4% quantum dots dispersion in toluene and 0.4 g silicone after which the residual toluene was removed. The mixture was dispensed and cured as described above. For comparison another sample was prepared without benzoic acid.

The HTOL behavior was the same for the acid containing and the other sample without benzoic acid. The slope of the WHTOL degradation curve was less for the sample containing benzoic acid was 30% smaller than that of the sample without benzoic acid.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A device for emitting light, comprising:
   a light generating element for generating light,
   a coating layer for converting the light generated by the light generating element, the coating layer being dispensed on a top surface of the light generating element, wherein the coating layer comprises
   a nano-composite including a plurality of nano-particles,
   a dispersion medium for dispersing the plurality of nano-particles, and
   a first composition comprising a weak acid or a salt thereof, the weak acid or the salt selected from at least one of benzoic acid, an acid forming the end group of a polydimethylsiloxane chain, potassium benzoate, caesium benzoate, lithium benzoate, calcium benzoate, and sodium benzoate.

2. Device according to claim 1, wherein the first composition comprises a solution or a fluid of the weak acid, the weak acid comprising a benzoic acid, a stearic acid, an acid substituted polydimethylsiloxane, polyphenylmethylsilcone or phenylsilicone.

3. Device according to claim 2, wherein the weak acid is dissolved in a solvent chemically compatible with the dispersion medium, the solvent comprising one or more of toluene, butyl-acetate, tert-butylacetate and THF.

4. Device according to claim 1, wherein the nano-composite comprises a quantum dot structure, the nano-particles comprising quantum dot particles.

5. Device according to claim 4, wherein the quantum dot structure is surrounded by a silica shell.

6. Device according to claim 1, wherein the dispersion medium comprises a silicone polymer composition, wherein the nano-composite is pretreated with the second composition such that the second composition reacts with the silicone polymer composition.

7. Device according to claim 1, further comprising a base composition comprising one or more of KOH, NaOH, CsOH, CaOH, and LiOH, wherein the alkali-silanolate comprises monovalent or divalent cation.

8. Device according to claim 1, wherein the coating layer comprises a first layer and a second layer, the first layer being dispensed on the top surface of the light generating element, the second layer being dispensed on the first layer.

9. Device according to claim 8, wherein the first layer comprises the dispersion medium and the first composition.

10. Device according to claim 8, wherein the second layer comprises the plurality of nano-particles.

11. Device according to claim 1, wherein the light generating element comprises a light emitting diode (LED).

12. Method for producing a light emitting device, comprising:
   providing a light generating element for generating light,
   providing a coating layer for converting the light generated by the light generating element, the coating layer being dispensed on a top surface of the light generating element, wherein the coating layer comprises
a nano-composite including a plurality of nano-particles,
a dispersion medium for dispersing the plurality of nano-particles, and
a first composition comprising a weak acid or a salt thereof, the weak acid or the salt selected from at least one of benzoic acid, an acid forming the end group of a polydimethylsiloxane chain, potassium benzoate, caesium benzoate, lithium benzoate, calcium benzoate, and sodium benzoate.

13. Method according to claim 12, wherein the coating layer is formed by dispersing the plurality of nano-particles in the dispersion medium prior to mixing the dispersion medium with the first composition, or by mixing the dispersion medium with the first composition prior to dispensing the nano-composite on the dispersion medium.

\* \* \* \* \*